United States Patent [19]

de la Houssaye

[11] Patent Number: 5,274,255
[45] Date of Patent: Dec. 28, 1993

[54] STRUCTURE FOR PROVIDING HIGH RESOLUTION MODULATION OF VOLTAGE POTENTIAL IN THE VICINITY OF A SURFACE

[76] Inventor: Paul de la Houssaye, 5681 Del Cerro Blvd., San Diego, Calif. 92120

[21] Appl. No.: 760,029

[22] Filed: Aug. 30, 1991

[51] Int. Cl.$^5$ ............................................. H01L 29/78
[52] U.S. Cl. .................................. 257/270; 257/194; 257/281
[58] Field of Search ................... 257/194, 281, 270

[56] References Cited

U.S. PATENT DOCUMENTS

| | | | |
|---|---|---|---|
| 3,803,461 | 4/1974 | Beneking | 257/281 |
| 4,511,813 | 4/1985 | Pan | 257/270 |
| 4,611,184 | 9/1986 | Kumar | 257/270 |
| 4,972,237 | 11/1990 | Kawai | 257/270 |
| 4,977,435 | 12/1990 | Yoshimura et al. | 257/194 |

FOREIGN PATENT DOCUMENTS 61-234570 10/1986 Japan .................................. 257/194

OTHER PUBLICATIONS

Gurvigch et al, 'High Quality Refractory Jose, Msen Tunnel Junctions...', Appl. Phys. Letts. 4265), Mar. 1, 1983, pp. 472-474.

Muller et al., *Device Electronics for IC's*, p. 496, 1986.

*Primary Examiner*—Jerome Jackson
*Assistant Examiner*—Stephen D. Meier
*Attorney, Agent, or Firm*—Harvey Fendelman; Thomas Glenn Keough; Michael A. Kagan

[57] ABSTRACT

A structure for modulating electrostatic potential in the vicinity of a surface of a structure comprises: a substrate; a first electrically conductive layer having an exposed surface and made of a first electrically conducive material formed on the subrate, the first electrically conductive material disposed to being transformed into an electrically insulating material; an electrically insulating layer formed on the surface of the first layer from the first electrically conducive material; and a second layer of a second electrically conductive material formed on the substrate and contiguous with the insulating layer so that a voltage potential between said first and second layers provides an electrostatic interaction with the substrate.

8 Claims, 2 Drawing Sheets

STRUCTURE FOR PROVIDING HIGH RESOLUTION MODULATION OF VOLTAGE POTENTIAL IN THE VICINITY OF A SURFACE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to a method for fabricating a structure which provides for the modulation of surface electrostatic fields over very short distances which may be applied to the fabrication of semiconductor devices.

The development of faster and faster electronic circuits and devices has been achieved through increasingly smaller devices and spacings between the elements comprising each device. Speed reductions have resulted from the reduction of electron or hole transit times due to the reduced distances, but as the development of advanced lithographic tools progressed to the point where patterns were transferable at lateral dimensions approaching tenth's of microns, quantum effects, such as ballistic overshoot, hot carrier effects, etc., had to be considered in the operation and design of these devices.

The development of various fabrication tools that allowed for the artificial structuring of materials on a vertical scale at the atomic level expanded the scope of even smaller and faster devices which could be fabricated. These tools included MBE (Molecular Beam Epitaxy), MOCVD (Metal-Organic Chemical Vapor Deposition), and other variants.

Significant research efforts in the field of heterostructure transistors have led to developments where it became possible to confine carriers in atomically smooth layers as thin as 80Å, the width of the electron(/hole) wave function itself, and to observe transport parallel to the confined layer. These efforts resulted in the MODFET (Modulation-Doped Field-Effect Transistor, also referred to as HFET and TEGFET), where carriers are believed to move within a two-dimensional electron (hole) gas and are confined parallel to the plane of the device in a "carrier sheet." This device requires efficient modulation of the underlying carriers beneath the "gate" of the device. The typical method for achieving this is to place metal electrodes on the surface of the device, and electrostatically couple the potentials on these electrodes to the channel.

The desire to have multiple gates on the surface shortly became evident. It was found that the efficiency of a device might be improved by utilizing two gates placed as closely as possible, instead of one, resulting in the split-gate MODFET. Successful fabrication of a vertical lateral resonant tunneling transistor lead to proposal of a lateral version, i.e., the lateral resonant tunneling transistor. However, to take full advantage of the quantum nature of this carrier sheet, described in the preceding paragraph, the electrodes should ideally be placed as close as possible.

The most common means for fabricating a small line on a semiconductor substrate is to utilize PolyMethyl-MethAcrylate (PMMA) or other electron-beam resist, expose it using an electron beam, develop the pattern, and transfer the pattern to a metal or semiconductor layer using standard liftoff or etching techniques. However, due to the existence of backscattered electrons and finite contrast value in the PMMA, single line/dot dimensions are limited to near 300Å. Should one desire a line-space array, the resolution is limited to perhaps line widths of 500Å, separated by about 500 Å.

These resolution limitations were acceptable a number of years ago. However, with processing advances and a growing interest in quantum sized devices, methods for producing even smaller lateral dimensions are desired. It appears that the limits of electron beam fabrication techniques alone have been reached. STM (Scanning Tunneling Microscope) techniques have been for moving individual atoms; however, the STM technique is very slow and not presently employable in a mass production environment. In addition, the fabrication of lines closely spaced presents another problem in actual operation. If the lines are spaced closely enough, an insulator must be placed between them to prevent catastrophic arcing between electrodes on the surface.

A need exists for a technique for manufacturing a structure which has electrodes spaced at dimensions at less than 300 to 500Å.

SUMMARY OF THE INVENTION

The present invention provides a method for manufacturing a structure for modulating electrostatic potential in the vicinity of a surface, comprising the steps of: forming a layer of resist over the surface of a material; selectively removing a specific region of the resist layer by exposing and developing the specific region; depositing a first electrically conductive material over the surface; removing the resist remaining on the surface and the conductive material overlying the resist so as to uncover a selected region of the first electrically conductive material; forming an electrically insulating layer over the uncovered first electrically conductive material; and depositing a second electrically conductive material over a selected region of the surface; whereby the first and second electrically conductive materials are electrically isolated from each other by the electrically insulating layer.

The invention also provides a structure for modulating electrostatic potential in the vicinity of a surface of a structure, comprising: a substrate; a first electrically conductive layer having an exposed surface and made of a first electrically conductive material formed on the substrate, the first electrically conductive material disposed to being transformed into an electrically insulting material; an electrically insulating layer formed on the surface of the first layer from the first electrically conductive material; and a second layer of a second electrically conductive material formed on the substrate and contiguous with the insulating layer so that a voltage potential between said first and second layers provides an electrostatic interaction with the substrate.

This process results in a structure for modulating electrostatic potential in the vicinity of a surface of a structure, comprising a substrate; a first electrically conductive layer formed on the substrate; an insulating layer formed on the first electrically conductive layer; and a second electrically conductive layer formed on a region of the insulating layer.

The significant advantage of the present invention is that it provides a method and structure by which electrodes may be placed on a surface, in conjunction with a common fine line fabrication method, where the resulting structure has electrodes with an effective distance between voltage nodes of approximately half that previously possible, i.e, as close as about 10Å.

DESCRIPTION OF THE PREFERRED EMBODIMENT

The present invention is a method for fabricating a structure which provides modulation with very high resolution of the electrostatic potential at or just below the surface of a substrate, which may for example, be a semiconductor, piezoelectric crystal, or other material for which it is desired to modulate a surface electric field. Electrode spacings of 60Å (Electrode to electrode distance) have been achieved, although this process can be used to create spacings less than or greater than this value.

Figure 1:
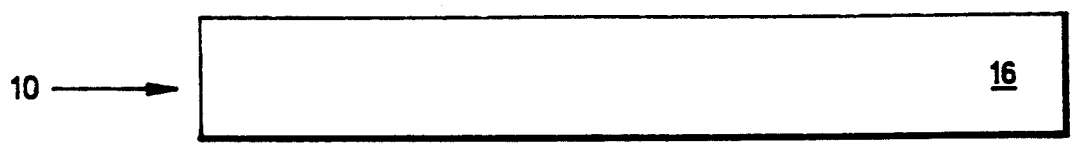
FIGS. 1-6 illustrate the various steps in the fabrication of a structure employing the methods of the present invention.
Figure 2:
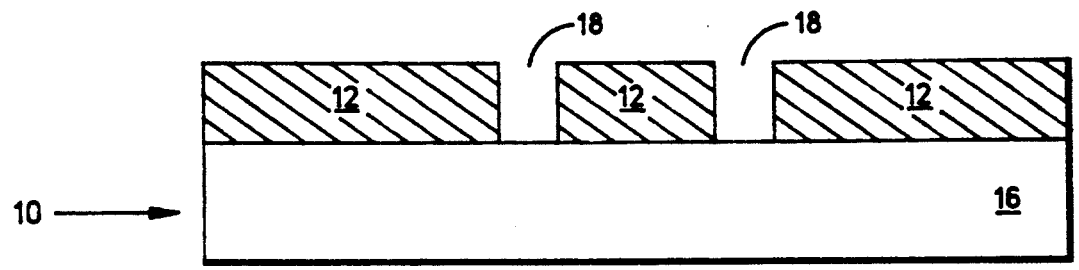
Figure 3:
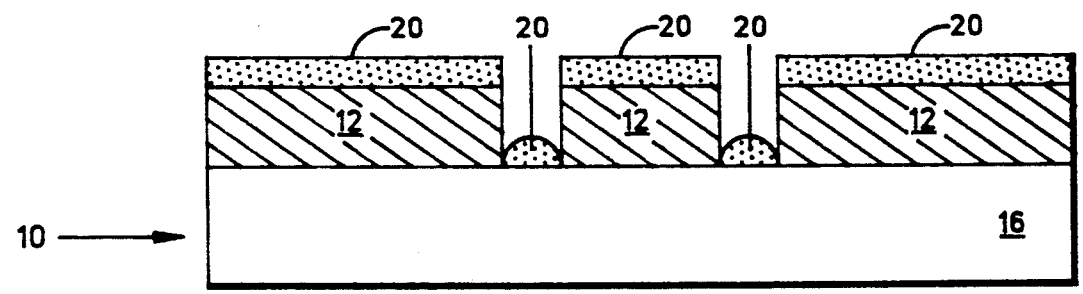
Figure 4:
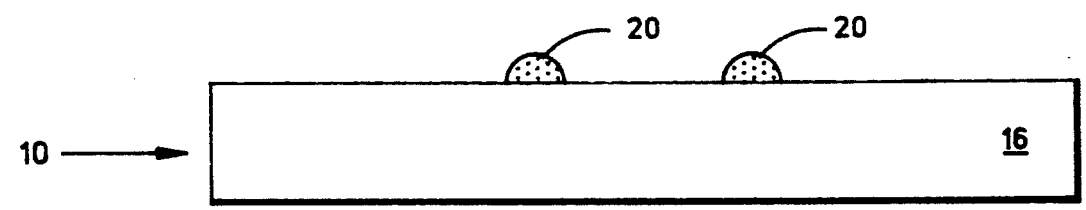

Referring to FIG. 1, wafer 10 is constructed by using standard liftoff (additive) or subtractive (e.g. etching techniques) for patterning a conductive layer on the surface of substrate 16. Substrate 16 may be a semiconductor such as diamond; silicon; gallium arsenide; a heterostructure that includes elements selected from any of Groups II, III, IV, V, and VI of the Periodic Table of Elements; a piezoelectric crystal; or a layered material structure. For purposes of illustration and by way of example, the liftoff method, using electron beam exposed resist, is described below with reference to FIG. 2. By first depositing a layer of resist 12, such as PMMA, on the surface of substrate 16, exposing and developing it using standard high resolution electron beam lithographic techniques, holes 18 are formed in resist 12 at predetermined locations. The minimum size and spacing of the holes are limited by the resist and the electron beam exposure system, which by the present state of the art may be as small as 300Å, but more typically 500Å. Next, a layer of conductive material 20 is deposited over wafer 10, as shown in FIG. 3. Referring to FIG. 4, resist 12 ten is removed, along with conductive material 20, originally on the remaining resist layer. Regions of conductive material 20 remaining on substrate 16 become electrodes (gates) 22 if the pattern is so designed. In some embodiments, it may be desirable for conductive material 20 and substrate 16 to be chemically non-reactive with each other, or a buffer layer may be interposed between. In the preferred embodiment, conductive material 20 should be capable of forming a uniform, partially self-limiting thin oxide having excellent electrical insulating qualities, i.e., a high breakdown field. Examples of suitable conductive material include aluminum and titanium. Aluminum is particularly well suited for use in this process because it readily forms an oxide sheet with excellent uniformity in the presence of oxygen. A uniform 50Å layer of aluminum can have a breakdown voltage of a few volts and can be formed by exposure to an oxygen atmosphere or isotropic plasma. Alternatively, an oxide skin may be formed over conductive material 20 if material 20 does not form a suitable thin oxide having excellent electrical insulating properties.

Figure 5:
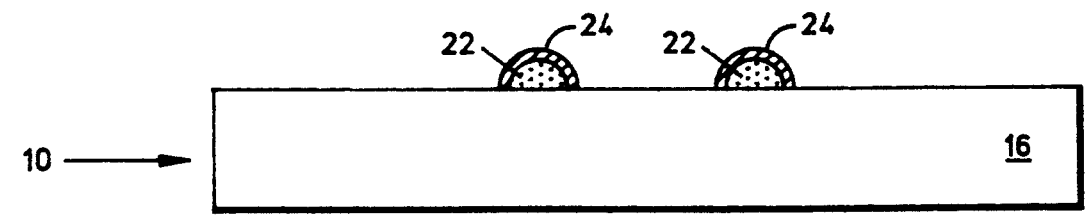

I As shown in FIG. 5, all exposed surfaces of gates 22 are oxidized to form oxide layer 24. By Way of example, oxide layer 24 was formed by exposing wafer 10 to an $O_2$ (oxygen) plasma flow (10 SCCM at 30 mTorr pressure, 30W rf power). This process step was followed by briefly exposing wafer 10 to water vapor in an oven heated to 1100° C. Wafer 10 was further exposed to 2 minutes of additional oxygen plasma. This process resulted in an aluminum oxide sheet having a breakdown voltage of approximately 2.8V and a thickness estimated to be 35-65Å. Gates (metal electrodes) were fabricated in this manner having lengths of approximately 500Å and widths on the order of $10^1$ μm. Most importantly, the interior of gate 22 remained unchanged and as conductive as material 20. This left an unoxidized aluminum conductor having a dimension of about 400Å. However, it is to be understood that oxidation of conductive material 20 may be accomplished in any number of ways, as would be well known by those skilled in this field of technology. Oxidation of conductive material 20 is preferably accomplished isotropically. Oxidation may also be achieved by taking advantage of the self-limiting oxide skin formation of some conductive materials so that all surfaces, including the partially hidden ones in between the electrodes are converted to an oxide layer to prevent shorting between conductive material 20 and conductive material 26, described below.

Figure 6:
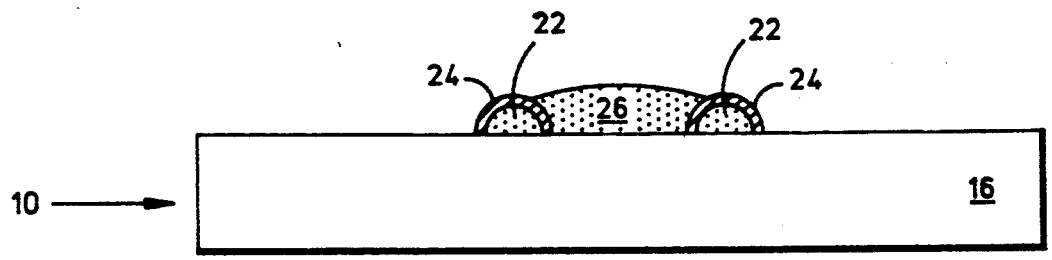

Referring to FIG. 6, after formation of oxide layer 24, conductive layer 26 is deposited in a pattern over wafer 10 to form an inner gate between gates 24. Conductive layer 26 may be any electrically conductive metal such as aluminum, titanium, gold, and silver, or semiconductor, or superconductor material. Layer 26 may be patterned in a similar way as the first conductive layer 20, but less resolution would be required. This beneficially results in a structure that has three electrodes (electrically conductive materials 22 and 26, as shown in FIG. 6) spaced at a distance half of that which could be achievable than that available with patterned conductive layers 20 only, as shown in FIG. 4. An important advantage of the present invention is that the distances between conductive materials 22 and conductive material 26 is fixed not by lithographic limitations. Instead, these distances are only limited by the breakdown voltage of the oxide necessary for the requirements of a particular application. Depending upon the application, it need not be a highly conductive material due to the distances involved. Conductive layer 20 was formed of aluminum which was deposited extremely slowly at an initial rate of 0.5 sec. for the first 100Å, and then at 15Å/sec. for the remaining 635Å in order to prevent destruction of oxide layer 24. Each individual gate/conductive line 22 may be connected to a different potential, as with the intervening conductive material 26. This process results in a structure that provides modulation of voltage potential at a surface with a resolution of about 150Å between voltage nodes. However, the limitation of the spacing between nodes depends on the maximum breakdown voltage expected between adjacent electrodes, the minimum oxide thickness required to prevent breakdown, and the minimum size of the interior electrode necessary to carry the current necessary for the operation of the device. Thus, smaller spacing would be achievable under certain circumstances, such as where a lower breakdown voltage is required.

Figure 7:
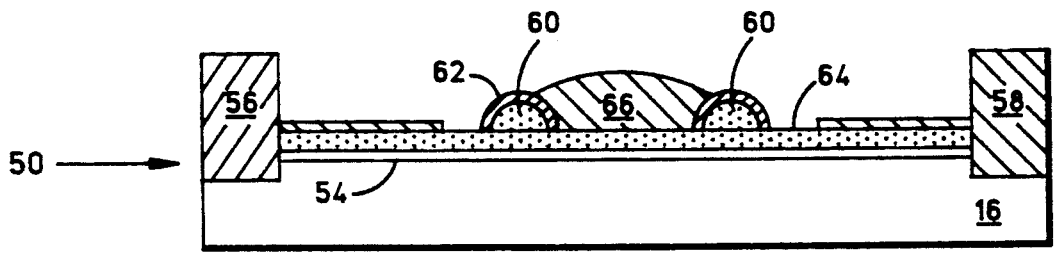
FIG. 7 shows a lateral resonant tunneling transistor manufactured in accordance with the methods of the present invention.
Figure 8:
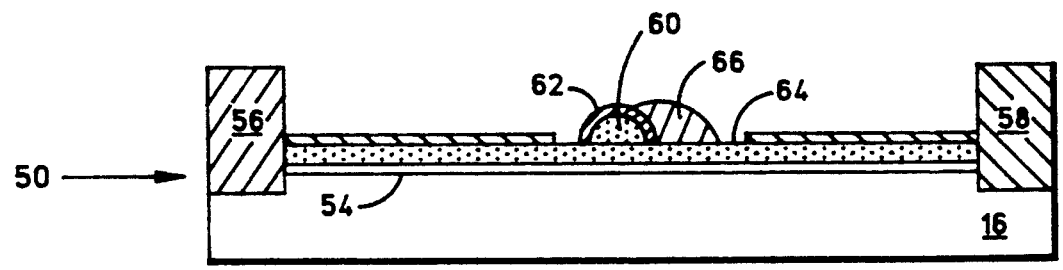
FIG. 8 shows a split-gate field effect transistor manufactured in accordance with the methods of the present invention.

This process may be employed to construct a lateral resonant tunneling transistor (LRTT) described with reference to FIG. 7, or a split gate field-effect transistor, as shown in FIG. 8, if only two adjacent metal gates are used. With reference to FIG. 7, by way of example, implementation of the method of the present invention in the manufacture an LRTT using a MODFET structure is described as follows: Wafer 50 is shown to include a multiple layer substrate within which two-dimensional electron gas (2-DEG) layer 54 has been formed beneath the surface of substrate 16. Ohmic contacts 56 and 58 are fabricated so as to be electrically coupled to 2-DEG layer 54. One contact serves as a source while the other is a drain. Two or more aluminum gates 60 having oxidized surfaces 62 are manufactured on semiconducting layer 64 using the techniques described above. Finally, aluminum layer 66 is patterned between gates 60 on wafer 50 as shown. The two-dimensional electron gas layer 54 can be modulated by the potentials placed on gates 60 and the overlying aluminum layer 66. In this example, a structure is produced having two gates with a spacing not limited by lithographic process constraints. While the example above is directed to the manufacture of a MODFET, the present invention may also be employed in the fabrication of other devices such as silicon or other semiconductor MOSFETs, as well as quantum effect devices.

A major advantage of the present invention is that the surface of semiconductor 64 between interior gates 60 is completely passivated. This reduces surface leakage currents between gates 60.

It is to be understood that the scope of the present invention is by no means limited to the specific method described herein. A number of structures where extremely closely spaced electrodes (gates) are desired would benefit from application of the present invention.

Other methods for forming insulating layers 24 and 6 besides oxidation. For example, nitridization of a material can be employed to form an insulating layer, or skin, in a manner similar to that of the formation of the oxide layer.

Obviously, many modifications and variations of the present invention are possible in light of the above teachings. It is therefore it is to be understood that within the scope of the appended claims, the invention may be practiced otherwise than as specifically described.

What is claimed is:

1. A structure for modulating electrostatic potential in the vicinity of a surface of a structure comprising:
   a substrate including a semiconductor material which is a layered heterostructure that includes elements from any of Group II, III, IV, V, and VI of the Periodic Table of Elements;
   a layer of an electrically conductive and oxide forming metal selected from the group of aluminum and titanium formed on said substrate, said layer of oxide forming metal having an exposed surface;
   a layer of electrically nonconductive material formed on said surface of said oxide forming metal, said nonconductive material formed from said metal by subjecting said exposed surface of said layer of said oxide forming metal to an oxidizing atmosphere; and
   an electrically conductive material removed on said substrate and contiguous with said second layer so that a voltage potential between said layer of said oxide forming metal and said layer of said electrically nonconductive material provides an electrostatic interaction with said substrate.

2. The structure of claim 1 wherein:
   said insulating layer has a thickness of about 5 to 200Å.

3. The structure of claim 2 wherein:
   said second layer has a breakdown voltage of as much as 10 volts.

4. The structure of claim 2 wherein:
   said first and third layers are separated by a distance of at least 10Å.

5. The structure of claim 1 wherein said second layer is a thin skin of nitride.

6. A structure for modulating electrostatic potential in the vicinity of a surface of a structure, comprising:
   a substrate which is a piezoelectric crystal;
   a layer of an electrically conductive and oxide forming metal selected from the group of aluminum and titanium formed on said substrate and having an exposed surface;
   a layer of electrically nonconductive material formed on said exposed surface of said oxide forming metal by exposing said first layer to an oxidizing atmosphere; and
   a layer of an electrically conductive material formed on said substrate and contiguous with said layer of electrically nonconductive material so that a voltage potential between said layer of oxide forming metal and said electrically nonconductive material provides an electrostatic interaction with said substrate.

7. A structure for modulating electrostatic potential in the vicinity of a surface of a structure comprising:
   a substrate made of a semiconductor which is a layered heterostructure that includes elements from any of Group II, III, IV, V, and VI of the Periodic Table of Elements
   a layer of an electrically conductive and oxide forming metal selected from the group of aluminum and titanium formed on said substrate and having an exposed surface;
   a thin skin of an electrically nonconductive oxide formed of said exposed surface of said layer of metal; and
   a layer of electrically conductive material formed on said substrate and contiguous with said thin skin of oxide so that a voltage potential between said first and second layers provides an electrostatic interaction with said substrate.

8. A structure for modulating electrostatic potential in the vicinity of a surface of a structure comprising:
   a substrate made of a semiconductor which is a piezoelectric crystal
   a first layer formed on said substrate and having an exposed surface, said first layer made of an electrically conductive and oxide forming metal selected from the group of aluminum and titanium;
   a second layer of an electrically nonconductive thin skin of oxide formed on said surface of said first layer and from said metal; and
   a third layer of an electrically conductive material formed on said substrate and contiguous with said second layer so that a voltage potential between said first and second layers provides an electrostatic interaction with said substrate.

* * * * *